United States Patent [19]

Wilkie et al.

[11] Patent Number: 5,425,996
[45] Date of Patent: Jun. 20, 1995

[54] BIAXIALLY ORIENTED POLYPROPYLENE METALLIZED WHITE FILM

[75] Inventors: Andrew F. Wilkie, Haverhill; Michael D. Butler, North Andover, both of Mass.

[73] Assignee: Borden, Inc., Columbus, Ohio

[21] Appl. No.: 223,171

[22] Filed: Apr. 5, 1994

[51] Int. Cl.⁶ .................... B32B 15/08; B32B 27/00
[52] U.S. Cl. .................... 428/461; 428/457; 428/500; 428/515
[58] Field of Search ............ 428/304.4, 307.3, 308.4, 428/349, 461, 910, 515, 457, 500

[56] References Cited

U.S. PATENT DOCUMENTS

| | | | |
|---|---|---|---|
| 4,230,767 | 10/1980 | Isaka et al. | |
| 4,293,608 | 10/1981 | Isaka et al. | 428/220 |
| 4,357,383 | 11/1982 | Howden et al. | 428/213 |
| 4,692,380 | 9/1987 | Reid | 428/349 |
| 4,741,950 | 5/1988 | Liu et al. | 428/315.5 |
| 4,758,390 | 7/1988 | Crass et al. | 264/145 |
| 4,777,081 | 10/1988 | Cras et al. | 428/215 |
| 4,997,700 | 3/1991 | Bothe et al. | 428/216 |
| 5,026,592 | 6/1991 | Janocha et al. | 428/204 |
| 5,091,236 | 2/1992 | Keller et al. | 428/213 |
| 5,134,173 | 7/1992 | Joesten et al. | 521/139 |
| 5,176,954 | 1/1993 | Keller et al. | 428/317.9 |
| 5,194,318 | 3/1993 | Migliorini et al. | 428/215 |
| 5,209,884 | 5/1993 | Wood, Jr. | 264/41 |
| 5,318,834 | 6/1994 | Foulkes et al. | 428/304.4 |

OTHER PUBLICATIONS

Technical Information Bulletin FC-25B of Hercules, Inc. for Hercules WTF503.
Borden Technical Bulletins, "CCO-Two Side Modified OPP Film", Mar. 18, 1994.
Borden Technical Bulletins, "OPPtiwrap TM OHC-TW-White OPP Film", Feb. 1, 1994.

*Primary Examiner*—Patrick J. Ryan
*Assistant Examiner*—William A. Krynski
*Attorney, Agent, or Firm*—Stevens, Davis, Miller & Mosher

[57] ABSTRACT

There is disclosed an oriented, polyolefin film having a white-opaque skin layer on one side of a core layer and a vacuum deposited metal layer on the other side of the core layer. The sealable polyolefin layer contains: (a) a slip agent in an amount sufficient to provide not more than about an 0.4 coefficient of friction to the surface of such layer; and (b) from about 10 to 40% by weight of titanium dioxide. The core layer is substantially free of opacifying filler and/or opacifying voids. The other side of the film is metallized to an optical density of at least 1.5 whereby the white pigment in the sealing layer in cooperation with the metallization gives a strong white-opaque appearance to the sealing layer.

20 Claims, No Drawings

BIAXIALLY ORIENTED POLYPROPYLENE METALLIZED WHITE FILM

FIELD OF THE INVENTION

This invention relates to an oriented polymeric alpha-olefin laminated film which has a core, a titanium dioxide containing white-partially opaque heat sealable skin layer on one side of the core, and a metallized surface on the other side of the core. The titanium dioxide in cooperation with the obverse metallized surface provides a strong white-opaque appearance when viewing the sealable layer. The film is suitable for the manufacture of snack food packages. In a preferred form, the film is biaxially oriented and contains significant quantities of isotactic polypropylene homopolymer.

BACKGROUND OF THE INVENTION (a) Field of the Invention

In the packaging of snack foods it is common practice to employ an outer coated metallized surface to provide both aesthetic and functional properties to the package. The aesthetic properties include an attractively printed package on a normally shiny metallized background whereas the functional properties include the blockage of light transmission which causes deterioration of such foods. It is also desirable to have the appearance of a white-opaque color on the inside of the package, e.g., the inside of a bag of potato chips. The white-opaque color suggests cleanliness and also masks or minimizes the appearance of oil from snack foods.

(b) Discussion of the Prior Art

Alpha-olefin polymeric films have been produced using a cavitated/expanded core in order to achieve opacity. However, the cavitated/expanded cores adversely affect the tensile strength and other physical properties of the film. Such films have also used fillers in the core to achieve opacity. Again, the physical properties of the core are adversely affected and it generally requires very substantial quantities of filler to achieve opacity when opacity is due solely to the use of fillers. The literature relating to such opaque films also recite, a layer or layers which are optionally: metallized; printed on one side in a white color; and the use of fillers. However, none of the prior art discloses the specific combination of this invention. The following references are illustrative of the prior art.

1. U.S. Pat. No. 5,091,236 of Feb. 25, 1992 to L. Keller et al. discloses a multilayer opaque, biaxially oriented polymeric film. The film structure includes: (a) a core layer having voids which cause a significant degree of opacity; (b) a layer adhering to the core layer including up to about 12% of titanium dioxide: and a titanium dioxide-free non-voided thermoplastic skin layer adhering to the other side of the core layer. The titanium dioxide improves opacity and whiteness of the film.

2. U.S. Pat. No. 4,741,950 of May 03, 1988 to L. Liu et al. discloses an oriented, opaque, alfa-olefin laminate film having a non-blocking first surface, a Smooth lustrous second surface which is intended for further film processing operations such as metallization and an expanded core to provide opacity. The core can optionally also contain additional filler for opacity and the anti-blocking skin layer optionally contains 2% to 8% of titanium dioxide to confer enhanced opacity. Among other shortcomings this patent uses voids in the core which adversely affect the mechanical properties and the anti-blocking layer is not heat sealable.

3. U.S. Pat. No. 4,357,383 of Nov. 02, 1982 to M. Howden et al. discloses a multi-layer metallized film of an alpha-olefin having on at least one surface an adherent layer of random copolymer of ethylene with 0.5 to 15% of 3–6 carbon alpha-olefin and a metallic layer on the surface of the adherent layer remote from the substrate. Among a number of options, this film can also have a heat seal layer on the surface opposite from the metallized layer.

4. U.S. Pat. No. 4,692,380 of Sep. 08, 1987 to D. Reid discloses a metallized, biaxially oriented polypropylene film which exhibits good adhesion between the polypropylene and the metal coating. The core has on at least one surface a propylene-ethylene copolymer which contains no slip agent and which has been subjected to corona treatment.

5. U.S. Pat. No. 4,997,700 of Mar. 05, 1991 to L. Bothe et al. discloses a metallizable, heat sealable, biaxially oriented multilayer film which comprises a polypropylene core layer, a first polyolefin heat-sealable surface layer and a second polyolefin metallizable surface layer. The metallizable layer comprises a propylene-ethylene copolymer containing from 1.2 to 2.8% of ethylene. The heat sealable layer comprises ethylene containing polymers, copolymers of ethylene and propylene or copolymers of propylene and 1-butane as well as other olefinic mixtures.

6. U.S. Pat. No. 5,026,592 of Jun. 25, 1991 to S. Janocha et al. discloses an opaque, biaxially stretched oriented, polyolefinic multilayered film comprising an opaque core layer and two transparent skin layers. The opaqueness is attained by the use of inorganic fillers in the core layer. Titanium dioxide is mentioned along with many different fillers as suitable. Among many different options the top layers can be sealable or non-sealable and metallized or non-metallized.

7. U.S. Pat. No. 4,758,396 of Jul. 19, 1988 to B. Crass et al. discloses biaxially oriented film having a single ply or an opaque core layer of a multiply film composed essentially of polypropylene. The opaque core layer includes 10–40% of filler. Titanium dioxide is mentioned as one of the fillers. In addition to the polypropylene opaque single ply or multiply layered film such film can include functional layers such as heat sealing, cold sealing, adhesion promoting, dye coating, and metallizable layers.

HERCULES WTF 503 is a non-heat sealable film having a white-opaque oriented polypropylene core and a metallizable surface. This product is sold by Hercules, Inc. for the insulation market.

In the invention of this application, an alpha-olefin polymer layer containing a slip agent and titanium dioxide are used to form a heat sealable layer which cooperates with a metallized surface on the opposite side of the core layer to enhance the white coloration of the titanium dioxide containing layer. Preferably, the sealable layer is coextruded on to a bulk core layer of a conventional, non-pigmented, non-cavitated and non-expanded, alpha-olefin of 2 to 4 carbon atoms. Also, there is generally coextruded on the reverse side of the core a skin layer of an alpha-olefin having 2 to 4 carbon atoms suitable for further treatment and metallization.

The present invention has the following four main advantages over the prior art:

1. A significant white-opaque appearance is achieved without the need for cavitation, expansion, or inert filling of the core layer. This also eliminates the need for white color printing of the film. This provides the use of smaller quantities of filler to attain the white-opaque look as compared to fillers in the core, provides better mechanical properties, and is more economical.

2. The white pigmented layer is heat sealable over a wide temperature range in spite of the relatively large percentage concentration of filler in this thin layer.

3. The excellent mechanical properties of conventional polyolefin films, e.g., biaxially oriented isotactic polypropylene homopolymer film, are maintained versus cavitated, expanded, or filled opaque polyolefin film.

4. Thinner gauges of laminated film can be used versus cavitated/expanded, opaque alfa-olefin film thus providing a cost advantage.

The inventive film has: a solid white-opaque appearance; excellent heat sealability and sealing range temperature; good machinability; a low coefficient of friction (COF); excellent gas barrier properties; good metal bond strengths; and excellent tensile strength.

SUMMARY OF THE INVENTION

This invention provides a white-opaque, oriented, and metallized polyolefin film prepared from at least 2 polyolefin layers. One layer is a heat sealing skin layer which contains: (a) a slip agent in an amount sufficient to provide not more than about an 0.4 coefficient of friction to the surface of such layer; and (b) from about 10 to 40% of titanium dioxide. Another layer is the core layer which is transparent and substantially free of cavitations, opacifying expansions, or fillers. The obverse surface from the sealing layer is metallized to an optical density of at least 1.5 whereby the white pigment in the sealing layer in cooperation with the metallization gives a strong white-opaque appearance to the sealing layer.

DETAILED DESCRIPTION OF THE INVENTION

The polyolefin contemplated as the core material includes polymers, e.g., homopolymers and interpolymers such as co- and terpolymers of propylene, ethylene, butene (butylene), as well as other alpha-olefins having up to 10 carbon atoms and mixtures thereof. Generally, the core contains some polyethylene such as a high density polyethylene, a random or block copolymer of ethylene and propylene, and mixtures thereof. Thus, the core can be that of isotactic polypropylene homopolymer together with from about 1% to 10% by weight of the core of high density polyethylene. The core is transparent and free of fillers and voids such as those caused by cavitation or expansion Which produce opaqueness. The isotactic polypropylene homopolymer used in this invention will contain at least about 80% and preferably at least 90% or 95% by weight of isotactic polypropylene units. Another core layer composition useable in this invention is that of a random or block copolymer of ethylene and propylene containing less than 10%, e.g. 2% to 8%, of ethylene, based on the weight of the copolymer, together with from 0 to 50% by weight of the core, and generally 1 to 45% by weight, of high density polyethylene. A preferred core is about 60 gauge in thickness and has a polyolefin composition of about 97% of isotactic polypropylene homopolymer and 3% of high density polyethylene based on the weight of the core.

Olefinic resin compositions employed for the heat sealable layer are comprised of block or random co- or terpolymers of ethylene, propylene, butylene, or other alpha-olefins having up to 10 carbon atoms and mixtures thereof, of the type conventionally employed for sealable layers. The sealable layer is generally that of random of block co- or terpolymers of propylene and/or butylene which contain from about 0.2 to 10% of ethylene based on the weight of the polymer. Illustratively, such layer can contain a random copolymer of ethylene and butylene with from about 0.1% to 2% of ethylene by weight of the copolymer. Another illustration is that of an ethylene-propylene random copolymer containing from 1% to 10% of ethylene in the copolymer. A preferred film has a sealable layer of about 7 gauge in thickness and contains, by weight of the core, a mixture of: about 30% ethylene-butylene random copolymer wherein 0.5% is ethylene; and 45% of ethylene-propylene random copolymer wherein 5% is ethylene.

The sealable skin layer will contain an effective amount of a slip agent to improve the mechanical properties of the surface of this layer. Generally, it is desirable to reduce the slip to a coefficient of friction (COF) of not more than about 0.4. By this means, blocking of adjacent layers of film on mill rolls is prevented and the film can readily be unwound for use or for further processing. The quantity of slip agent, also referred to herein as anti-blocking agent, is also sufficient to substantially eliminate blocking of the film. In the absence of the slip agent, the layer-to-layer COF is so great that smooth unwinding of the film is virtually impossible.

Illustrative of slip agents, also referred to as anti-blocking agents, there can be mentioned: cross-linked silicone, silica, silicates, clay, diatomaceous earth, talc, glass, and the like. Such solid slip agents are generally provided in the form of approximately spheroidal particles having a particle size range of from about 0.5 to about 10 microns. Additional slip or anti-block agents include the higher molecular weight fatty acid esters and amides such as stearamide or oleamide. Also, slip agents for the heat sealable layer can be small quantities, e.g. 1,000 to 3,000 parts per million (ppm) of 3 micron cross-linked silicone; 1,000 to 5,000 parts per million of glycerol monostearate; and mixtures thereof.

The amount of the slip agent in the heat sealable layer is that amount sufficient to prevent blocking and to provide good machinability such as that which provides the film layer with a COF of less than about 0.4. A preferred kinetic coefficient of friction on the sealable side is about 0.28. The coefficient of friction is measured by ASTM: D-1894-87.

The quantity of the slip or anti-blocking agent normally used in the film layer involved can vary from about 0.1% to 1% by weight such as 0.2 to 0.5%. In a preferred composition the slip agent is a mixture of 2,000 ppm of 3 micron cross-linked silicone and 3,000 ppm of glycerol monostearate. Preferred heat seal layers will have a kinetic coefficient of friction of about 0.28 with a minimum heat seal temperature of about 220° F. and a heat seal range of about 80° F. wherein the heat seal strength exceeds 200 grams per inch at 30 psi for half a second.

The sealable layer will have titanium dioxide dispersed therein. The quantity of particulate titanium dioxide in the sealable skin layer will vary from about 10% to 40% by weight of the skin layer such as about 15% to 35%. A concentration of 25% of rutile titanium dioxide is preferred. The heat sealability is unaffected by incorporation of these relatively large quantities of titanium dioxide.

When a separate, i.e., second alpha-olefin skin layer, is used for the metallizable surface instead of the core, such layer can be that of an alpha-olefin homopolymer or interpolymer having 1 to 4 carbon atoms, e.g., a homopolymer of isotactic polypropylene, a random or block ethylene-propylene copolymer and mixtures thereof. One such random copolymer is that of ethylene and propylene containing less than 10% by weight of ethylene, e.g. 2% to 8%. As with the core, such second olefinic skin layer is transparent and substantially free of cavitation, voids, opacifying expansions, and fillers.

The second or obverse skin metallizable layer can optionally also contain an adhesion promoting agent to improve adhesion to the vacuum metallized metal surface. Such adhesion promoters include powdered polyamides, e.g. Nylon 6, clay, random copolymers of 1 to 4 carbon atoms as well as polar polymers such as those containing acrylic or methacrylic acid in a quantity sufficient to enhance adhesion of the metal to the treated skin surface. Such quantity can vary over a broad range such as from about 1,000 to 4,000 parts per million by weight of the metallizable skin layer. A preferred metallizable layer has a thickness of about 3 gauge and has a polyolefin composition which consists of isotactic polypropylene homopolymer and about 2,500 ppm of Nylon 6.

The metallization is preferably achieved by placing a vacuum deposited metal, preferably aluminum, layer on to a non-sealable corona treated skin layer or core surface of the film. In many applications, a thin transparent polymeric film, e.g., polypropylene, is placed over the metallization in order to protect it from abrasion, etc.

The amount of metal deposition on the treated second skin layer should be sufficient to provide an optical density to the film of at least 1.5 such as 1.75 or 2.0, and preferably 2.4. Optical density is measured with a MacBeth TD. 904 Optical Densitometer. Such densitometer has an optical density range of 0 to 4 with 0 being 100% light transmission and 4 being 0% light transmission. An optical density of 2 has a light transmission of 1%. Preferred metallizable film of this invention having a heat sealable layer, a core, and a metallizable layer, prior to corona treatment and metallization, will have a light transmission of about 74%. Thus, it can be seen that the titanium dioxide in the sealing layer does not have much effect on opaqueness.

The thickness of the core layer can vary over a wide range such as that of from about 30 to 200 gauge, e.g. from about 40 to 120 gauge, and preferably about 60 gauge, i.e. 60 thousandths of an inch. In structures wherein the metallizing is on a separate polyolefin layer from that of the core, the thickness of such layer can vary from about 0.5 to 20 gauge such as from about 1 to 10 gauge and preferably about 3 gauge. The thickness of the heat sealing layer can vary from about 2 to 20 gauge such as 4 to 10 gauge and preferably about 7 gauge. The thicker gauge provides the greater amount of whiteness. In preferred compositions, the metallized film has a core layer, a heat seal layer, a metallizable layer, and the vacuum deposited metal layer wherein the total thickness of such film is about 0.7 mil.

Manufacture of the polyolefin film according to the invention is carried out by known coextrusion processes. This includes coextruding through a flat film die the melt corresponding to the individual layers of the film, cooling the film obtained by coextrusion in order to harden it, orienting, e.g. biaxially stretching, the film, heat-setting the stretched film and corona treating the metallizable surface layer. The film can also be made by the blown film or double bubble orientation process.

The composition of the sealable layer is preferably produced employing the masterbatch method, e.g., the titanium dioxide is first intimately dispersed With the alpha-olefin polymer, generally a block or random copolymer of 2 to 4 carbon atoms, and such mixture is then mixed in with the remaining ingredients of the heat sealable film layer. A masterbatch which applicants have found to be particularly suitable is P8555SC of A. Schulman, Inc. which contains about 50% by weight of titanium dioxide and about 50% of ethylene-propylene random copolymer.

The laminated film structure comprising the core and adherent skins is stretched by conventional techniques to orient the film, prior to corona discharge and deposition of a metallic layer on to the metallizable skin layer. Orientation may be effected uniaxially, by stretching the film in one direction or biaxially, by stretching the film in each of two mutually perpendicular directions in the plane Of the film. Biaxial orientation is preferred.

The degree to which the film is stretched depends to some extent on the ultimate use for which the film is intended. Preferably, the film is stretched to between about 4 to 6.5 times its original dimension in the longitudinal direction and about 5 to 10 times in the transverse direction. The longitudinal stretching is expeditiously carried out with the aid of two rolls running at different speeds according to the stretch ratio desired and the transverse stretching with the aid of a corresponding tenter frame.

After stretching the polymeric film is normally "heat set", while restrained against shrinkage at a temperature above the glass transition temperature of the polymer and below its melting point.

Prior to deposition of the metallic layer onto the separate adherent metallizable layer or the exposed surface of the core itself when a separate layer is not used, the exposed surface thereof is subjected to a physical surface-modifying treatment to improve the bond between that surface and the subsequently applied metal which forms a metallic layer. A preferred treatment is to subject the exposed surface to a high voltage electrical stress accompanied by corona discharge. The film is then heat aged to impart further dimensional stability to the film.

Deposition of the metallic layer onto the skin layer may be effected by conventional metallizing techniques, but preferably by a vacuum deposition process in which the metal is evaporated on to the receptive polyolefin surface in a chamber maintained under conditions of high vacuum. Suitable metals include nickel, copper, silver, gold, zinc, and preferably aluminum. As mentioned earlier, a thin transparent polymeric film can be adhered over the metallization in order to protect it such as from abrasion in handling of a finished package made from the composite film. The composite film which has been produced in this manner is wound up in the customary manner with the aid of a wind-up unit.

Preferred films of this invention can have tensile strengths of about 19,000 psi in the machine direction and 38,000 psi in the transverse direction.

All parts and percentages given in this specification and claims is by weight unless the context clearly indicates otherwise.

What is claimed is:

1. An oriented composite polyolefin film comprising:

A. a polyolefin heat sealable layer containing a slip agent in an amount sufficient to provide a coefficient of friction to such layer of not greater than about 0.4 and from about 10% to 40% by weight of titanium dioxide;

B. a polyolefinic core layer on one side of the sealable layer, said core layer being substantially free of cavitations, voids and fillers, and C. an obverse metallized layer on the side of the core opposite said heat sealable layer, said metallized layer being sufficient to provide an optical density of at least 1.75 to the film and wherein the titanium dioxide in the heat sealable layer is enhanced by the obverse metallized layer to provide a white-opaque coloration to the heat sealable layer.

2. The film of claim 1 wherein at least 90% by weight of the core layer is isotactic polypropylene homopolymer.

3. The film of claim 2 wherein the sealable layer is fabricated from alpha-olefin block and random interpolymers having from 2 to 10 carbon atoms.

4. The film of claim 3 which is biaxially oriented.

5. The film of claim 4 wherein metal, forming said metallized layer, is deposited on a transparent layer of an alpha-olefinic polymer of 2 to 4 carbon atoms adhering to the other side of the core.

6. An oriented composite white-opaque polymeric film comprising:

A. A core layer, a heat sealable skin layer, and a metallized obverse skin layer wherein:

(1) the core layer is transparent and fabricated of an alpha-olefin polymer having 2 to 10 carbon atoms;

(2) the obverse skin layer is vacuum metallized to attain an optical density of at least 1.5; and (3) the sealable layer comprises alpha-olefinic block and random polymers having from 2 to 10 carbon atoms and wherein such layer contains an anti-blocking agent in a quantity sufficient to render said layer substantially non-blocking and titanium dioxide in an amount sufficient to be enhanced by the metallized layer to provide a white-opaque color to the film when viewed from the side of the sealable layer.

7. The film of claim 6 wherein the polymer of the metallized layer is a member selected from the group consisting of isotactic polypropylene homopolymer, a block or random alpha-olefin polymer having 2 to 4 carbon atoms and mixtures thereof.

8. The film of claim 6 wherein the thickness of the core layer is from about 50 to 120 gauge; the thickness of the obverse skin layer is from about 1 to 10 gauge; and the thickness of the heat sealable layer is from about 4 to 10 gauge.

9. The film of claim 6 wherein at least 90% by weight of the core layer is isotactic polypropylene homopolymer.

10. The film of claim 6 wherein the sealable layer contains from 10 to 40% by weight of titanium dioxide filler.

11. The film of claim 6 which has an optical density of at least 1.75.

12. A biaxially oriented polymer film comprising, by weight:

A. a transparent core layer having a thickness of about 50 to 120 gauge fabricated from a member selected from the group consisting of (a) an ethylene-propylene random copolymer or block copolymer with from 0 to 50% of high density polyethylene, (b) isotactic polypropylene homopolymer with from about 1% to 10% by weight of high density polyethylene, and (c) mixtures thereof;

B. a 4 to 10 gauge heat sealable skin layer adhering to one surface of the core layer said sealable layer containing a member selected from the group consisting of (a) an ethylene-propylene random or block copolymer containing from about 0.2% to 10% by weight of ethylene, (b) an ethylene-butylene random or block terpolymer containing about 0.2% to 10% by weight thereof of ethylene, (c) an ethylene-propylene-butylene random or block copolymer containing about 0.2 to 10% by weight thereof of ethylene, and (d) mixtures thereof, said sealable layer containing 10% to 40% of titanium dioxide and a slip agent in a quantity sufficient to provide a coefficient of friction of about 0.2 to 0.4; and C. a second transparent layer of about 1 to 10 gauge adhering to the other surface of the core layer, said second layer containing a member selected from the group consisting of (a) an ethylene-propylene random or block copolymer containing not more than 10% of ethylene, (b) an isotactic propylene homopolymer, and (c) mixtures thereof, said second transplant layer having a vacuum deposited coating of metal providing an optical density of at least 1.75 to the film.

13. The film of claim 12 wherein the optical density is at least 2 and the metal is aluminum.

14. The film of claim 12 wherein the core layer is fabricated from isotactic polypropylene homopolymer and 1% to 10% by weight of high density polyethylene.

15. The film of claim 12 containing from 15% to 35% of titanium dioxide.

16. The film of claim 6 wherein the core layer is fabricated of an alpha-olefin polymer having 2 to 4 carbon atoms.

17. The film of claim 6 wherein the core layer is fabricated of an alpha-olefin polymer having 2 to 3 carbon atoms.

18. The film of claim 1 wherein the obverse layer is free of filler.

19. The film of claim 6 wherein the obverse layer is free of filler.

20. The film of claim 12 wherein the second transparent layer is free of filler.

* * * * *

UNITED STATES PATENT AND TRADEMARK OFFICE
CERTIFICATE OF CORRECTION

PATENT NO. : 5,425,996
DATED : JUNE 20, 1995
INVENTOR(S) : ANDREW F. WILKIE ET AL.

It is certified that error appears in the above-indentified patent and that said Letters Patent is hereby corrected as shown below:

Column 4,    line 66, change "i$" to --is--.

IN THE CLAIMS

Column 8,    line 22, change "terpolymer" to --copolymer--;

lines 24-25, change "copolymer" to --terpolymer--; and line 38, change "transplant" to --transparent--.

Signed and Sealed this

Twelfth Day of December, 1995

Attest:

BRUCE LEHMAN

*Attesting Officer*    *Commissioner of Patents and Trademarks*